(12) United States Patent
Hikita et al.

(10) Patent No.: US 6,404,060 B1
(45) Date of Patent: Jun. 11, 2002

(54) SEMICONDUCTOR DEVICE HAVING A CHIP-ON-CHIP STRUCTURE

(75) Inventors: Junichi Hikita; Hiroo Mochida, both of Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/496,191

(22) Filed: Feb. 2, 2000

(30) Foreign Application Priority Data

Feb. 4, 1999 (JP) ............................................. 11-027640

(51) Int. Cl.⁷ .............................................. H01L 23/48
(52) U.S. Cl. ........................ 257/777; 257/355; 257/361; 257/362; 257/546; 257/566; 257/572; 257/778
(58) Field of Search ................................ 257/723, 173, 257/355, 361, 362, 546, 566, 572, 777, 778

(56) References Cited

U.S. PATENT DOCUMENTS

| 4,697,095 A | * | 9/1987 | Fujii | ........................... 307/243 |
| 5,523,622 A | * | 6/1996 | Harada et al. | ............... 257/734 |
| 5,644,164 A | * | 7/1997 | Weiler et al. | ................ 257/777 |
| 6,046,901 A | * | 4/2000 | Davis et al. | ................ 361/303 |
| 6,198,136 B1 | * | 3/2001 | Voldman et al. | ............. 257/357 |

FOREIGN PATENT DOCUMENTS

| JP | 11-195744 | | 7/1999 | |
| JP | 11-195744 A | * | 7/1999 | ........... H01L/23/56 |

* cited by examiner

Primary Examiner—Eddie Lee
Assistant Examiner—Matthew E. Warren
(74) Attorney, Agent, or Firm—Arent Fox Kintner Plotkin & Kahn, PLLC

(57) ABSTRACT

A semiconductor device has a first semiconductor chip having a device formed thereon and a second semiconductor chip having a protection circuit for protecting the device formed thereon. The second semiconductor chip is superposed on and bonded to the surface of the first semiconductor chip.

2 Claims, 4 Drawing Sheets

SEMICONDUCTOR DEVICE HAVING A CHIP-ON-CHIP STRUCTURE

BACKGROUND OF THE INVENTION

1. Field of the Invention

The present invention relates to a semiconductor device having a device such as a transistor or laser diode and a protection circuit therefor.

2. Description of the Prior Art

FIG. 5 is an electrical circuit diagram showing the circuit configuration of a conventional driving circuit for driving an inductive load L such as a motor. This driving circuit is composed of four NPN-type transistors Q1, Q2, Q3, and Q4, which are so connected as to form a bridge circuit, with the NPN-type transistors Q1 and Q2 making a pair connected in series and the NPN-type transistors Q3 and Q4 making another pair connected in series. The node between the NPN-type transistors Q1 and Q2 is connected to one end of the load L, and the node between the NPN-type transistors Q3 and Q4 is connected to the other end of the load L.

The transistors Q1, Q2, Q3, and Q4 have diodes D1, D2, D3, and D4 connected thereto individually in the reverse direction so as to form a surge protection circuit. A back electromotive force developed in the inductive load L causes a surge voltage higher than the supplied voltage to appear across the inductive load L. Such a surge voltage, if any appears, is led through the diodes D1, D2, D3, and D4 to the power lines (Vcc and GND). This helps protect the transistors Q1, Q2, Q3, and Q4 by preventing the surge voltage from being applied directly thereto.

A similar protection circuit is provided also in a laser diode or the like. Here, between the two terminals of the laser diode, a diode is connected so as to absorb a surge voltage.

When the driving circuit shown in FIG. 5 is formed on a semiconductor chip to produce a bipolar IC, it is customary to form the NPN-type transistors and the diodes constituting the protection circuit in separate device formation regions from one another, with P-type separation regions formed between them, so that different devices are electrically separated from one another by a so-called PN separation structure. In this case, although the P-type separation regions need to be kept at the lowest potential, a surge voltage from the inductive load L does not ensure that the P-type separation regions are kept at the lowest potential, and this may hinder the PN separation structure from achieving satisfactory separation between different devices. That is, the parasitic transistors formed near the P-type separation regions conduct and thereby allow the NPN-type transistors, even though formed in different device formation regions, to affect one another, causing crosstalk. For this reason, it has conventionally been difficult to form a driving circuit having a surge protection circuit in a bipolar IC.

Moreover, a device that is formed singly, such as a laser diode, has a structure different from ordinary structures, and therefore it has also been difficult to form such a device into a one-chip IC incorporating a surge protection circuit therefor.

Thus, there is no choice but to form a device requiring surge protection and a protection circuit therefor in two separate ICs. This lowers the integration density of such devices.

SUMMARY OF THE INVENTION

An object of the present invention is to provide a semiconductor device that, despite having a device requiring surge protection and a protection circuit therefor, allows the substantial integration density to be improved.

To achieve the above object, according to one aspect of the present invention, a semiconductor device is provided with a first semiconductor chip having a device formed thereon and a second semiconductor chip having a protection circuit for protecting the device formed thereon, and the second semiconductor chip is superposed on and bonded to the surface of the first semiconductor chip.

In this structure, a device and a protection circuit therefor are formed on separate semiconductor chips, and one of these semiconductor chips is superposed on and bonded to the other so as to form a semiconductor device having a so-called chip-on-chip structure. This helps avoid the difficulties that are inevitable when a device and a protection circuit therefor are formed on a single chip, and simultaneously improve the substantial integration density.

According to another aspect of the present invention, a semiconductor device is provided with a first semiconductor chip having a plurality of bipolar transistors formed thereon and a second semiconductor chip having a protection circuit for protecting the bipolar transistors formed thereon, and the second semiconductor chip is superposed on and bonded to the surface of the first semiconductor chip.

In this structure, devices and the protection circuit therefor are formed on separate semiconductor chips, which are then superposed on and bonded to each other so as to form a semiconductor device having a so-called chip-on-chip structure. This helps avoid the difficulties that are inevitable when devices and a protection circuit therefor are formed on a single chip, and simultaneously improve the substantial integration density.

BRIEF DESCRIPTION OF THE DRAWINGS

This and other objects and features of the present invention will become clear from the following description, taken in conjunction with the preferred embodiments with reference to the accompanying drawings in which.

DESCRIPTION OF THE PREFERRED EMBODIMENTS

Hereinafter, embodiments of the present invention will be described with reference to the accompanying drawings.

First Embodiment

Figure 1:
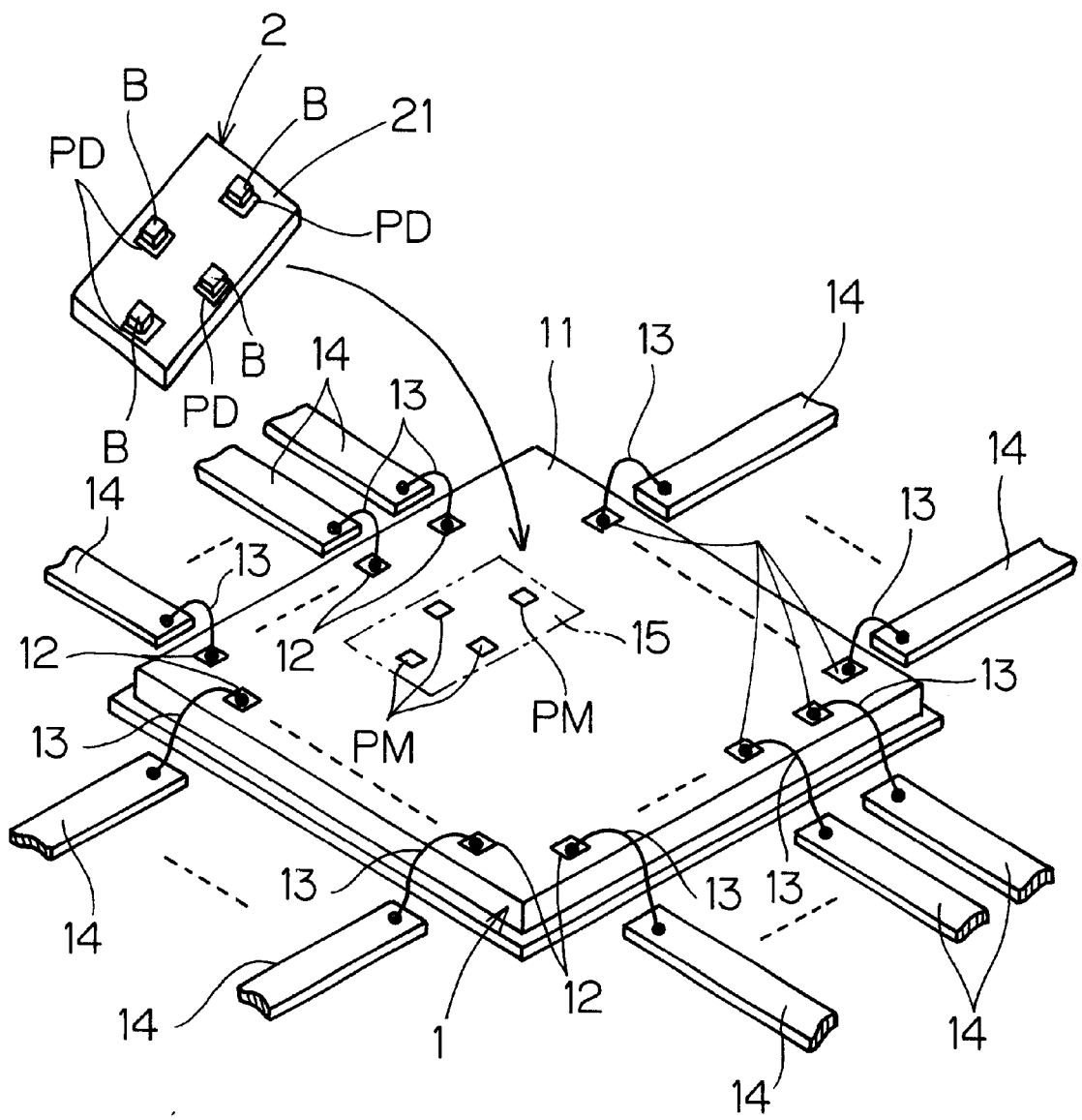
FIG. 1 is an exploded perspective view of the semiconductor device of a first embodiment of the invention.

First, the semiconductor device of a first embodiment of the invention will be described with reference to FIGS. 1 to 3. FIG. 1 is an exploded perspective view of the semiconductor device of the first embodiment of the invention. This semiconductor device has, as a first semiconductor chip, a mother chip 1, and has, as a second semiconductor chip, a daughter chip 2 superposed on and bonded to the surface 11 of the mother chip 1. Thus, this semiconductor device has a so-called chip-on-chip structure.

The mother chip 1 is formed out of, for example, a silicon chip. Its surface 11, i.e. that side of the semiconductor substrate constituting the base of the mother chip 1 on which an active surface-layer region lies in which functional devices such as transistors are formed, is covered with an insulating protective film as the topmost layer. Above this protective film, a plurality of pads 12 for external connection are arranged so as to be exposed in predetermined positions near the edge of the substantially rectangular and flat surface 11 of the mother chip 1. These external connection pads 12 are to be connected to lead frames 14 by way of bonding wires 13.

In an inner region on the mother chip 1, a bonding region 15 is provided so as to allow the daughter chip 2 to be bonded thereto. In this bonding region 15, a plurality of chip-to-chip connection pads PM are arranged for achieving connection with the daughter chip 2.

The daughter chip 2 is formed out of, for example, a silicon chip. The surface 21 of the semiconductor substrate constituting the base of this daughter chip 2, i.e. that side thereof on which an active surface-layer region lies in which functional devices such as transistors are formed, is covered with an insulating protective film as the topmost layer. Above this protective film, a plurality of pads PD. are formed so as to be exposed in positions corresponding to the chip-to-chip connection pads PM formed on the mother chip 1. On these pads PD. individually, bumps B are formed that are made of an oxidation-resistant metal such as gold, lead, platinum, silver, or iridium.

The daughter chip 2 is bonded to the mother chip 1 with the surface 21 of the former facing the surface 11 of the latter. This bonding is achieved by pressing the mother and daughter chips 1 and 2 onto each other until they are bonded together with the bumps B individually kept in contact with the chip-to-chip connection pads PM formed in the bonding region 15. During this bonding, supersonic vibration is applied, as required, to the mother chip 1 and/or the daughter chip 2 to achieve secure bonding between the bumps B and the chip-to-chip connection pads PM.

Figure 2:
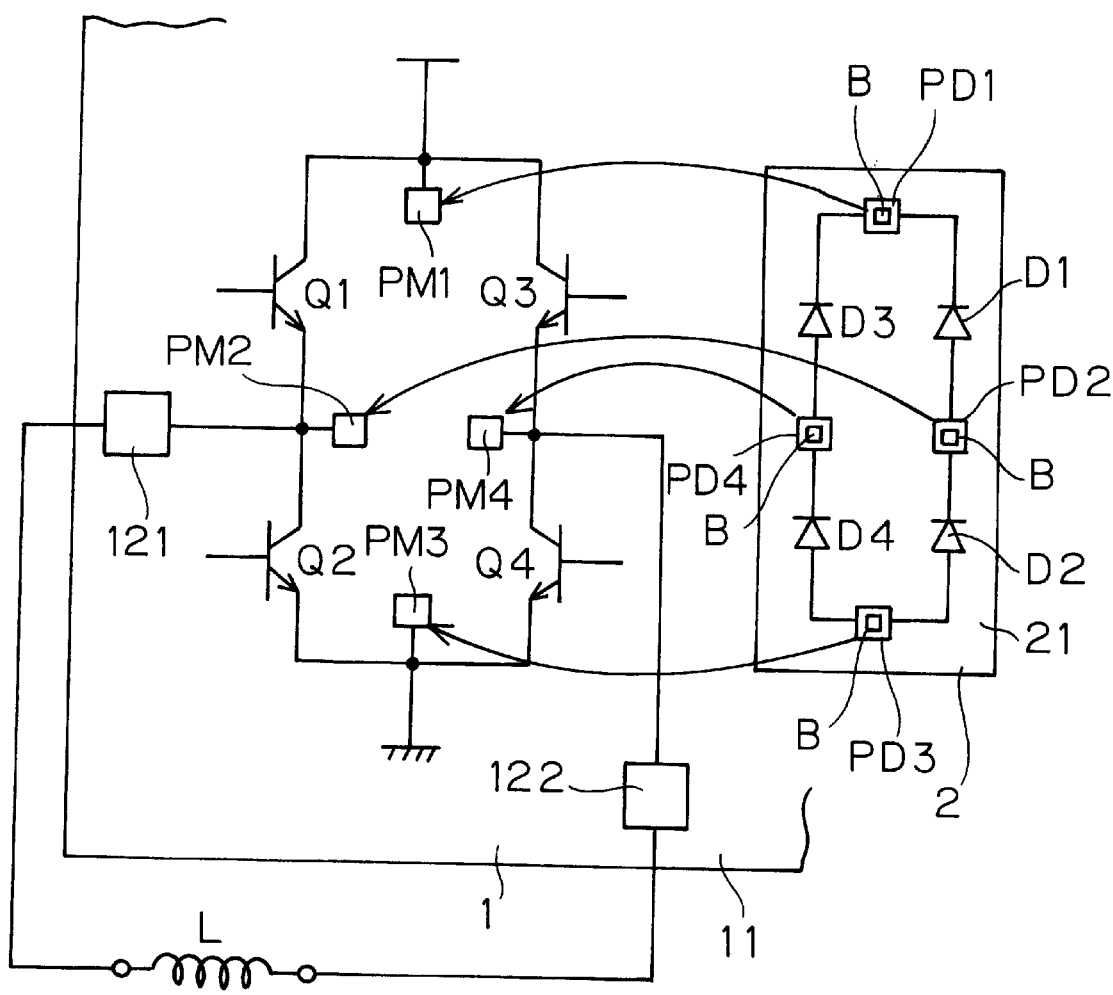
FIG. 2 is a schematic circuit diagram showing the electrical configuration of the semiconductor device shown in FIG. 1.

FIG. 2 is a schematic circuit diagram showing the electrical structure of the semiconductor device shown in FIG. 1. Specifically, the mother chip 1 has NPN-type transistors Q1, Q2, Q3, and Q4 formed thereon that are so connected as to form a bridge circuit, and the daughter chip 2 has diodes D1, D2, D3, and D4 formed thereon that are so connected as to form a bridge circuit and constitute a protection circuit for the transistors Q1, Q2, Q3, and Q4.

On the surface 11 of the mother chip 1 are formed a pad PM1 connected to the collectors of the transistors Q1 and Q3, a pad PM2 connected to the emitter of the transistor Q1 and to the collector of the transistor Q2, a pad PM3 connected to the emitters of the transistors Q2 and Q4, and a pad PM4 connected to the emitter of the transistor Q3 and to the collector of the transistor Q4. These pads PM1 to PM4 are all included among the chip-to-chip connection pads PM.

The node between the transistors Q1 and Q2 is connected to an external connection pad 121 that is to be connected to a lead frame 14 (see FIG. 1). The node between the transistors Q3 and Q4 is connected to an external connection pad 122 that is to be connected to another lead frame 14. These external connection pads 121 and 122 are both included among the external connection pads 12.

On the other hand, the pads PD. formed on the surface 21 of the daughter chip 2 include a pad PD1 connected to the cathodes of the diodes D1 and D3, a pad PD2 connected to the anode of the diode D1 and to the cathode of the diode D2, a pad PD3 connected to the anodes of the diodes D2 and D4, and a pad PD4 connected to the anode of the diode D2 and to the cathode of the diode D4. These pads PD1 to PD4 are formed in positions in which they face respectively the pads PM1 to PM4 formed on the mother chip 1. Thus, when the daughter chip 2 is superposed on and bonded to the surface 11 of the mother chip 1, the pads PM1 to PM4 are bonded respectively to the bumps B formed on the pads PD1 to PD4.

Figure 3:
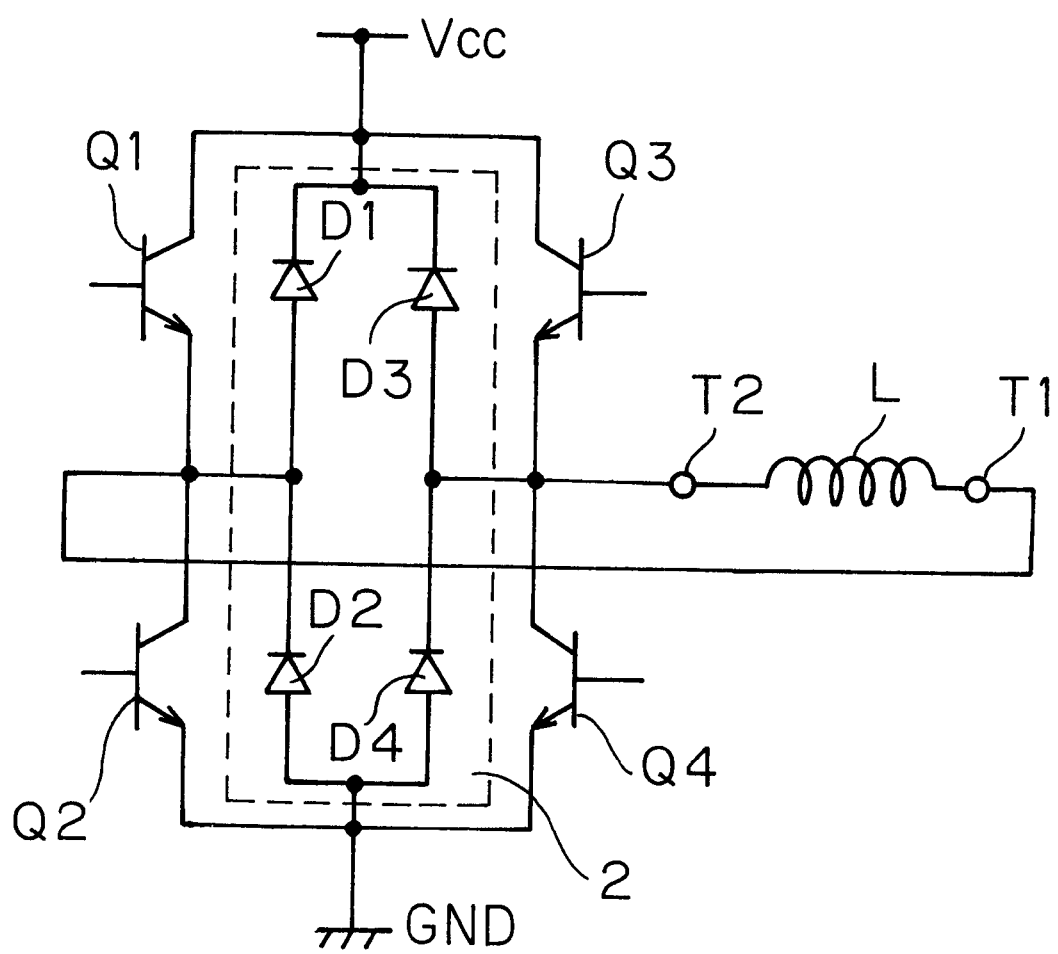
FIG. 3 is an electrical circuit diagram showing the configuration of a driving circuit, embodying the invention, for driving an inductive load such as a motor.
Figure 5:
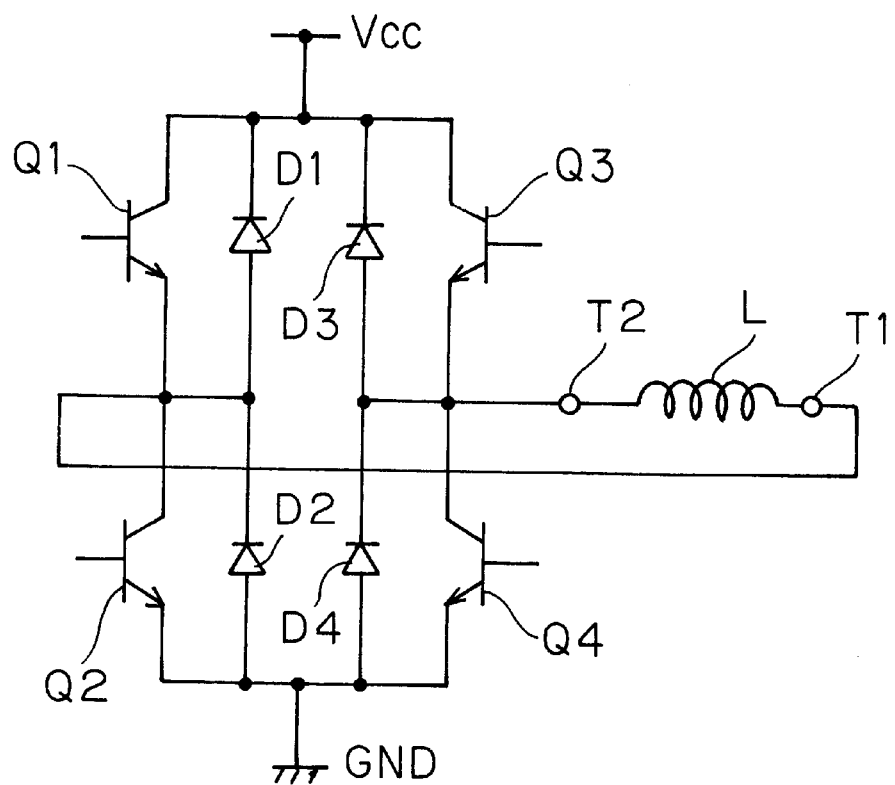
FIG. 5 is an electrical circuit diagram showing the configuration of a conventional driving circuit for driving an inductive load such as a motor.

FIG. 3 is an electrical circuit diagram showing the configuration of a driving circuit, embodying the invention, for driving an inductive load such as a motor. Note that, in FIG. 3, such elements as are found also in the conventional example shown in FIG. 5 are identified with the same reference numerals and symbols. This driving circuit is composed of NPN-type transistors Q1, Q2, Q3, and Q4 formed on a mother chip 1 so as to form a bridge circuit and diodes D1, D2, D3, and D4 formed on a daughter chip 2 so as to form a bridge circuit, with the NPN-type transistors Q1 and Q2 making a pair connected in series and the NPN-type transistors Q3 and Q4 making another pair connected in series. The node between the transistors Q1 and Q2 is connected, via a first terminal T1, to one end of an inductive load L, and the node between the transistors Q3 and Q4 is connected, via a second terminal T2, to the other end of the inductive load L. Here, the entire driving circuit incorporating a surge protection circuit shown in FIG. 3 is formed by superposing the daughter chip 2 on the mother chip 1 and bonding it thereto in such a way that the cathode of the diode D1 is connected to a supplied-voltage line Vcc, that the cathode of the diode D2 is connected to the anode of the diode D1 and to the first terminal T1, that the anode of the diode D2 is connected to a ground line GND, that the cathode of the diode D3 is connected to the supplied-voltage line Vcc, that the cathode of the diode D4 is connected to the anode of the diode D3 and to the second terminal T2, and that the anode of the diode D4 is connected to the ground line GND. This driving circuit as a whole constitutes a driving circuit just like that shown in FIG. 5 described previously.

In this structure, the chip having the transistors Q1 to Q4 formed thereon and the chip having the diodes D1 to D4 formed thereon are formed separately. This helps prevent the adverse effects of the parasitic devices formed between the protection devices and the internal circuit. Moreover, the daughter chip 2 is superposed on and bonded to the mother chip 1 so as to form a semiconductor device having a chip-on-chip structure, which can be handled substantially as a single chip and thus allows the mother and daughter chips 1 and 2 to be sealed in resin together. This helps improve the substantial integration density.

Second Embodiment

Figure 4:
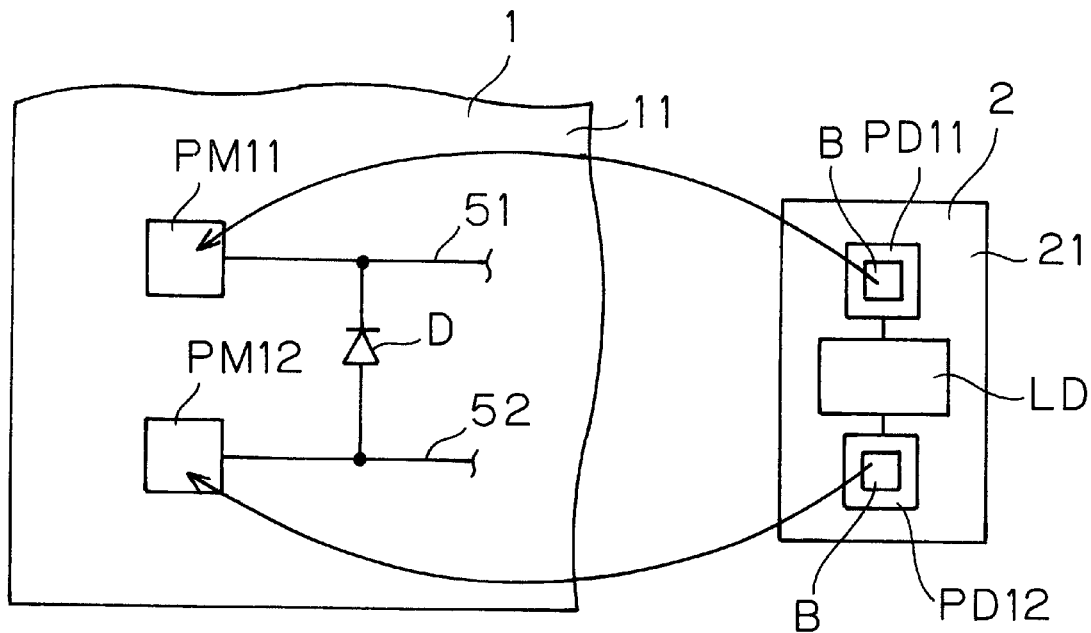
FIG. 4 is a schematic circuit diagram of the semiconductor device of a second embodiment of the invention.

Next, the semiconductor device of a second embodiment of the invention will be described with reference to FIG. 4. FIG. 4 is a schematic circuit diagram of the semiconductor device of the second embodiment of the invention. Also in this embodiment, the semiconductor device has a chip-on-chip structure, with a daughter chip 2 bonded on the surface of a mother chip 1. Therefore, what is shown in FIG. 1 described previously applies also to the following descriptions.

In this embodiment, the daughter chip 2 is built as a laser diode chip, which is a single-device chip, and the mother chip 1 constitutes a driving circuit for driving the laser diode. The mother chip 1 has driving signal lines 51 and 52 formed thereon, and has chip-to-chip connection pads PM formed on the surface 11 thereof. The chip-to-chip connection pads PM include pads PM11 and PM12 that are connected to the driving signal lines 51 and 52 respectively. Moreover, in the vicinity of the pads PM11 and PM12, a surge protection diode D (a protection circuit)is formed between the driving signal lines 51 and 52.

The daughter chip 2 has a laser diode device LD formed therein, and has pads PD. formed on the surface 21 thereof. The pads PD. include pads PD11 and PD12 that serve as the two terminals of the laser diode device. These pads PD11 and PD12 are formed in positions that correspond to the positions where the pads PM11 and PM12 are formed on the mother chip 1. Thus, when the daughter chip 2 is superposed on and bonded to the surface 11 of the mother chip 1, the pads PM11 and PM12 are bonded to the bumps B formed on the pads PD11 and PD12.

In this structure, the daughter chip 2 is built as a laser diode chip, i.e. a single-device chip having a very small size, and therefore it is impossible to form a protection circuit for the laser diode device LD within the daughter chip 2; instead, a surge protection diode D is formed on the part of the mother chip 1, which is formed separately from the daughter chip 2. This helps avoid the difficulties that are inevitable when a protection circuit is formed in a single-device chip, and simultaneously improve the substantial integration density, because this structure allows a laser diode and a protection circuit therefor to be integrated in a semiconductor device having a chip-on-chip structure, which can be handled substantially as a single chip.

The present invention can be carried out in any other way than it is carried out in the two embodiments described above. For example, although the above-described embodiments deal with cases in which bumps B are formed on the daughter chip 2, it is also possible to form similar bumps on the mother chip 1, or form bumps on both the mother and daughter chips 1 and 2 so that chip-on-chip bonding between the mother and daughter chips 1 and 2 will be achieved by bonding the bumps together.

Moreover, instead of relatively high metal protrusions such as bumps, it is possible to use vapor-deposited metal films or the like.

Furthermore, although the above-described embodiments deal with cases in which only one daughter chip 2 is bonded to the surface 11 of the mother chip 1, it is possible to bond two or more daughter chips on the surface 11 of the mother chip 1.

Moreover, although the above-described embodiments deal with cases in which both the mother chip 1 and the daughter chip 2 are made of silicon, it is possible to use semiconductor chips made of any other material than silicon, such as gallium-arsenide or germanium, in semiconductor devices embodying the present invention. The first and second semiconductor chips may be made of either identical or different materials.

Obviously, many modifications and variations of the present invention are possible in light of the above teachings. It is therefore to be understood that within the scope of the appended claims, the invention may be practiced other than as specifically described.

What is claimed is:

1. A semiconductor device a first semiconductor chip having a device formed thereon;

a second semiconductor chip having a protection circuit for protecting the device formed thereon wherein the second semiconductor chip is superposed on and bonded to a surface of the first semiconductor chip,
wherein the first semiconductor chip comprises:
first and second NPN-type transistors whose collectors are connected to a supplied-voltage line;
third and fourth NPN-type transistors whose emitters are connected to a ground line;
a first terminal connected to an emitter of the first NPN-type transistor and to a collector of the third NPN-type transistor; and
a second terminal connected to an emitter of the second NPN-type transistor and to a collector of the fourth NPN-type transistor, and
the second semiconductor chip comprises:
a first diode whose cathode is connected to the supplied-voltage line;
a second diode whose cathode is connected to an anode of the first diode and to the first terminal and whose anode is connected to the ground line;
a third diode whose cathode is connected to the supplied-voltage line; and
a fourth diode whose cathode is connected to an anode of the third diode and to the second terminal and whose anode is connected to the ground line.

2. A semiconductor device as claimed in claim 1,
wherein an inductive load is connected between the first and second terminals.

\* \* \* \* \*